United States Patent
Sato et al.

[11] Patent Number: 5,886,564
[45] Date of Patent: Mar. 23, 1999

[54] TEMPERATURE COMPENSATION CIRCUIT FOR IC CHIP

[75] Inventors: Masatoshi Sato, Gyoda; Noriyuki Masuda, Ageo, both of Japan

[73] Assignee: Advantest Corp., Tokyo, Japan

[21] Appl. No.: 817,762

[22] PCT Filed: Nov. 29, 1994

[86] PCT No.: PCT/US94/13402

§ 371 Date: Sep. 2, 1997

§ 102(e) Date: Sep. 2, 1997

[87] PCT Pub. No.: WO96/17389

PCT Pub. Date: Jun. 6, 1996

[51] Int. Cl.[6] .......................................... H03K 3/42
[52] U.S. Cl. ........................ 327/513; 327/262; 327/378; 374/183; 324/158.1
[58] Field of Search ........................ 327/378, 262, 327/512, 513; 374/183; 324/158.1

[56] References Cited

U.S. PATENT DOCUMENTS

| | | | |
|---|---|---|---|
| 4,196,361 | 4/1980 | Nakata | 327/512 |
| 4,980,586 | 12/1990 | Sullivan et al. | 327/262 |
| 5,300,968 | 4/1994 | Hawkins | 327/513 |
| 5,336,939 | 8/1994 | Eitrheim et al. | 327/513 |

*Primary Examiner*—Kenneth B. Wells
*Attorney, Agent, or Firm*—Muramatsu & Associates

[57] ABSTRACT

A temperature compensation circuit which includes a signal detecting circuit provided on a signal supply path which outputs logic signals to a target circuit. Also included are switch elements which turn current on/off to heater elements each time the signal detecting circuit detects that the logic signals are being applied to the target circuit. The power source of the invention therefore only needs to endure the same amount of current applied to the target circuit which leads to a reduction in power consumption.

6 Claims, 9 Drawing Sheets

TEMPERATURE COMPENSATION CIRCUIT FOR IC CHIP

FIELD OF THE INVENTION

The present invention relates to a temperature compensation circuit to be used in a semiconductor IC, and more particularly, a temperature compensating circuit of a variable delay circuit in a digital integrated circuit (IC) which can compensate a signal transmission delay time by temperature.

BACKGROUND OF THE INVENTION

In an IC test apparatus having a plurality of test signal supply paths (hereinafter "channel") which provide test pattern signals to a plurality of pins of the IC to be tested, delay times among the channels should be matched. Thus, each delay time per each channel has to be adjusted to be same delay time and such adjusted delay time should be maintained for a long period of time. However, if IC circuits are employed to form each channel to decrease the size of the test apparatus, there arises a problem in that, in such IC circuits, delay times for propagation of signals vary depending on temperature changes.

Particularly, if the ICs with CMOS (complementary metal-oxide semiconductor) structure are used, such a change in the delay time conspicuous since the heat generation is completely different whether it is in rest or in operation. Namely, in the CMOS circuit, in a non-operational state (when no signals are generated therefrom), the amount of a current consumed therein is very small. In contrast, if the CMOS ICs are in an operational state (when a logic of the signal is inverted), they consume the current several thousand times as much as they do in the non-operational state. Thus, in the ICs with the CMOS structure, the amounts of the currents consumed therein are largely different between the operational and non-operational states. Accordingly, self-heating values in each state are different. If the operational and non-operational states are irregularly happen, the temperature of the IC chips increases only when they are in the operational state, which is impossible to control. As a result, mismatches of the delay times are caused between the channels.

In order to solve the above problem, the conventional device has employed ICs having temperature compensatory function for a circuit aiming to maintain the delay times in a certain period.

FIG. 9 shows a structure of the conventional IC having a temperature compensatory function therein. In FIG. 9, reference numeral 10 is a chip forming an IC. The chip 10 consists of a target circuit 11 to form a channel of the IC test apparatus and its delay time is to be maintained in a certain period, a temperature sensor 12 formed in a vicinity of the target circuit 11, a plurality of heater elements H dispersed in a vicinity of the target circuit 11, and a plurality of switch elements 13 for turning on/off a current applied to the heater elements H. In the conventional device, detecting signals from the temperature sensor 12 are given to a heater control device 20, control output signals from the heater control device 20 are given to the switch elements 13 wherein the current applied to the heater H is turned on/off so as to consistently maintain the temperature inside the chip 10.

Namely, when the target circuit 11 is in the non-operational state, the heater elements H is heated by a current (which is the same current as consumed in the target circuit 11) applied thereto. Then, an operation of the target circuit 11 begins so as to turn off the current applied to the heater elements H when a surrounding temperature of the target circuit 11 increases.

When a signal is given to the target circuit 11 and its operation begins, the temperature of the circuit increases. Then, the temperature sensor 12 detects the temperature change and shuts off the current applying to the heater elements H, causing the time delay. However, this conventional structure has a disadvantage in that: since the detection of the temperature change is subject to the temporary increase of the temperature inside the chip 10, it causes a fluctuation in the delay times.

Further, because of the delay in the detection, the currents are applied to both of the target circuit 11 and heater elements H. This means that an electric power source receives about twice as large current as the current consumed in the target circuit 11. Therefore, material used for the electric power source should endure at least twice as large current as the current consumed by the target circuit 11. The number of the electric power sources correspond to the number of the circuits 11. For example, in an IC test device, 100 electric power sources may be needed to match the number of the IC pins, that is 100 IC pins, resulting the increase of the manufacturing costs.

Another conventional method contains a circuit which controls the propagation delay time in an IC by controlling a heater in the IC and the amount of heat given to the IC by the heater. Namely, the conventional method realizes a control circuit for adjusting the signal propagation delay time in substantially constant time by controlling the temperature of the IC.

According to the conventional method, the propagation delay time of a signal which passes at least one part of the IC can be measured and compared with a standard delay time. If the measured delay time is shorter than the standard delay time, it is controlled to increase the heat generation of the heater. On the other hand, if the measured delay time is longer than the standard delay time, it is controlled to decrease the heat generation from the heater.

FIG. 10 is a block diagram showing a conventional structure disclosed in the Japanese Patent Laying-Open No. 1-114067. Since a delay measuring circuit 30 is included in an IC chip 32, a delay time in the delay measuring circuit 30 is affected by the temperature as substantially the same as other circuit in the chip IC 32.

A heater 34 thermally connected to the IC chip adjusts the signal transmission delay time by selectively heating the IC chip 32. The heater 34 is preferably an integrated heating element which is mounted on the IC chip 32 with other circuit components. The heater 34 is usually provided relatively near the delay measuring circuit 30. Thus, it is able to minimize the time delay until the delay measuring circuit 30 is heated by the heater 34. A typical IC chip using a metallic lead frame has a good thermal conductivity. Thus, it is able to transmit the heat generated by the heater 34 to each circuit inside the chip. Usually, a plastic or ceramic package 36 having a relatively good thermal insurability surrounds the chip 32. With the package 36, the inside of the IC chip can keep a higher temperature than an ambient temperature.

As described in the above, all circuits in the IC chip 32 are arranged to be in a vicinity each other and made of materials having high thermal conductivity. Therefore, all of the circuits inside the IC chip 32 are maintained in the uniform temperature. Further, factors changing the delay time in one circuit in the chip, such as the temperature and the voltage, are set to substantially equal in every circuit within the same IC chip. Therefore, it is possible to adjust the delay time of all circuits in the chip by measuring either one of the circuits, such as the delay measuring circuit 30, and adjusting the temperature in the chip based on its information.

A control means 40 controls the heater 34 based on the measured result of the delay time received from the delay measuring circuit 30. Namely, if a measured value of the delay time is shorter than a desired time, the control means 40 controls the heater 34 to increase the heat generation. In contrast, if a measured value of the delay time is longer than the desired time, the control means 40 controls the heater 34 to decrease the heat generation. Accordingly, the delay time is precisely controlled by this procedure.

A standard delay circuit 42 in FIG. 10 generates standard delay signals corresponding to a desired transmission delay time. A delay comparison circuit 44 compares a standard delay signal from the standard delay circuit 42 and a measured delay signal from the delay measuring circuit 30. The output of the delay comparison circuit 44 is indicative of a time difference between the desired delay time and the delay time which is actually measured. Then, the heater 34 is controlled by a heater control signal so as to decide whether the generated heat is maintained or adjusted, based on a relationship between the standard delay signal and the measured delay signal. A standard delay time setting circuit 50 including a micro processor sets up a desired standard delay time. Further, the delay measuring circuit 30 measures the transmission delay time in response to a test signal received from a test signal source 52.

According to the foregoing method, the temperature inside the IC chip can be substantially maintained. However, it is impossible for the conventional method to handle local temperature changes in a short period of time.

SUMMARY OF THE INVENTION

Therefore, it is a primary object of the present invention to minimize the temperature changes inside the chip and provide an IC having a temperature compensatory function which allows electric power sources having a capacity to endure the same current as consumed in the target circuit.

The first aspect of the present invention is characterized in that a signal detecting circuit is provided on a signal supply path which gives logical signals to the target circuit. The present invention is further characterized to include the switch elements which turn on/off the current applied to the heater elements provided in the ICs every time when the signal detecting circuit detects the supplies of signals to the target circuit.

The present invention allows to stop an application of the current to the heater elements every time when signals are supplied to the target circuit. The electric power source used in the present invention only needs to endure the same amount of current applied to the target circuit. This allows a remarkable reduction in electric consumption and associated costs.

It is a further object of the present invention to stabilize a heat fluctuation in an IC chip by providing a circuit arrangement and method for temperature compensating self-generating heat variations in a variable delay circuit when an operational frequency in the variable delay circuit varies.

In order to achieve the above-described object, the second aspect of the temperature compensation circuit of the present invention includes two variable delay circuits, one of which performs as an actual delay circuit for a channel, for example, for a test signal in an IC test apparatus while the other performs as a heater. The two delay circuits are formed in close proximity one another in an IC chip so that the temperature environment is identical for the two circuits. A selector is provided with two clock signals having different frequencies. The temperature compensation circuit further includes a logical delay circuit, a mask circuit and a clock number adjusting circuit.

The selector is controlled to select one of the clock signals to form, in cooperation with the logical delay circuit, a mask signal which prohibits for a certain period of time from passage of the clock signal having lower frequency. The output of the mask circuit is provided to the delay circuit and is used to form, for example, an actual test signal in the IC test apparatus. The masked output is also provided to the clock number adjusting circuit the output signal of which is provided to the other variable delay circuit (heater circuit).

The clock number adjusting circuit so functions that the number of clock signals to be provided to the heater circuit is controlled depending on the number of clock signals supplied to the variable delay circuit. For example, the clock number adjusting circuit controls the number of clock signals supplied to the heater circuit so that the sum of the number of clock signals supplied to the variable delay circuit and the clock signals supplied to the heater circuit is equal to the original clock signal of higher frequency. Therefore, the total number of clock signals in the two delay circuits (one of them is a heater circuit) is controlled to be constant, which makes the temperature of the IC chip also constant.

Therefore, according to the present invention, the temperature in the IC chip can be maintained to be constant, and accordingly, the signal propagation delay times for signals passing through the IC chip can also be maintained to be constant.

DETAILED DESCRIPTION OF THE INVENTION

Figure 1:
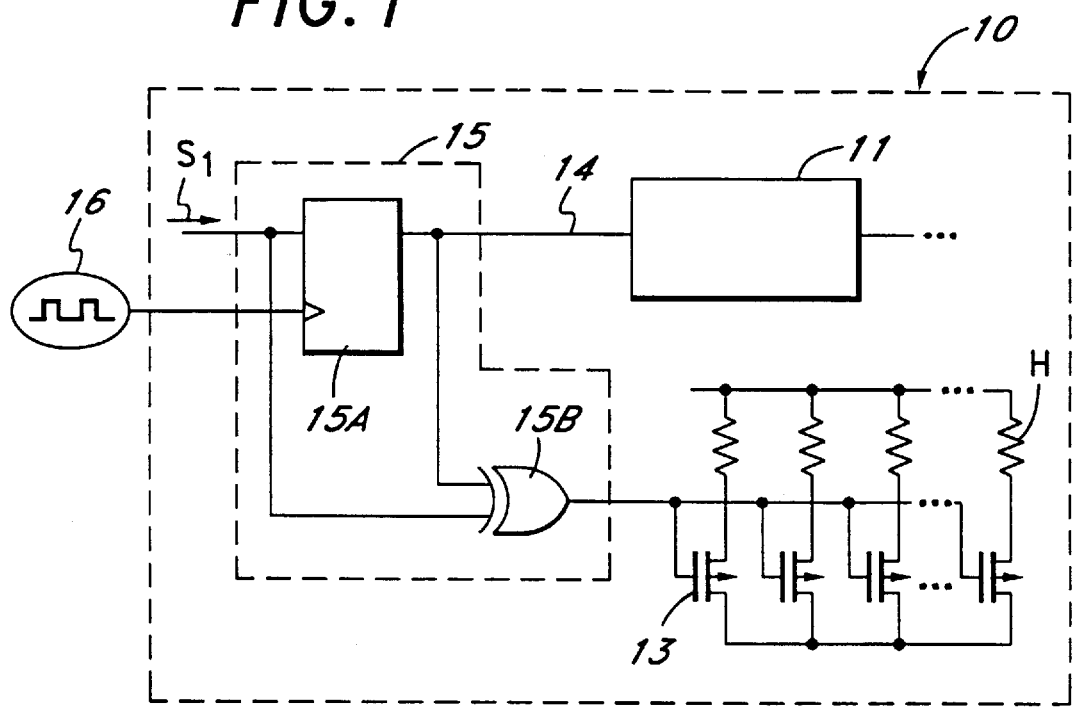
FIG. 1 is a circuit diagram showing a structure of temperature compensation in IC circuit of the present invention.

FIG. 1 shows one embodiment of the present invention. In the drawing, a reference numeral 10 is an IC chip. Reference numeral 11 is a target circuit. Reference H shows heater elements. Reference numeral 13 shows switch elements. In this embodiment, a signal detecting circuit 15 is provided on a signal supplying path 14 which supplies signals to the target circuit 11. In this embodiment, the signal detecting circuit is comprised of D-type flip flop 15A and a logical operator 15B which detects mismatched signals between an input and output sides of the D-type flip flop 15A. In this case, the logical operator 15B is an exclusive OR circuit. A clock signal CP (FIG. 2) having a constant cycle is given from a clock 16 to a clock input terminal of the D-type flip flop 15A. The clock 16 can be positioned either inside or outside of the chip 10.

When a drive signal $S_1$ shown in FIG. 2B is given to the signal supplying path 14, the drive signal $S_1$ is read in the flip flop 15A due to the rise of the clock CP. Then, the drive signal $S_1$ is transferred to the output side of the flip flop 15A with a delay of one cycle of the clock CP. Namely, the D-type flip flop 15A operates as a synchronizing circuit by giving the drive signal which is synchronized with the clock CP to the target circuit 11. FIG. 2C shows a waveform of a signal S2 which is an output of the D-type flip flop 15A.

Then, the logical operator 15B compares logical signals between the input and output sides of the flip flop 15A. If the logical operator 15B founds that there is a mismatch between the two logical signals, it outputs, for example, a H-logic signal. FIG. 2D shows an output of the logical operator 15B. As shown in the drawing, a H-logic signal $S_3$ is input to the switch element 13, as a result of the mismatch between the logic signals $S_1$ and $S_2$. In this embodiment, a P-channel FET (field effect transistor) is used for the switch elements 13. The P-channel FET is controlled to turn off when the H-logic signal is given to a gate and turn on when the L-logic signal is given thereto.

Figure 2:
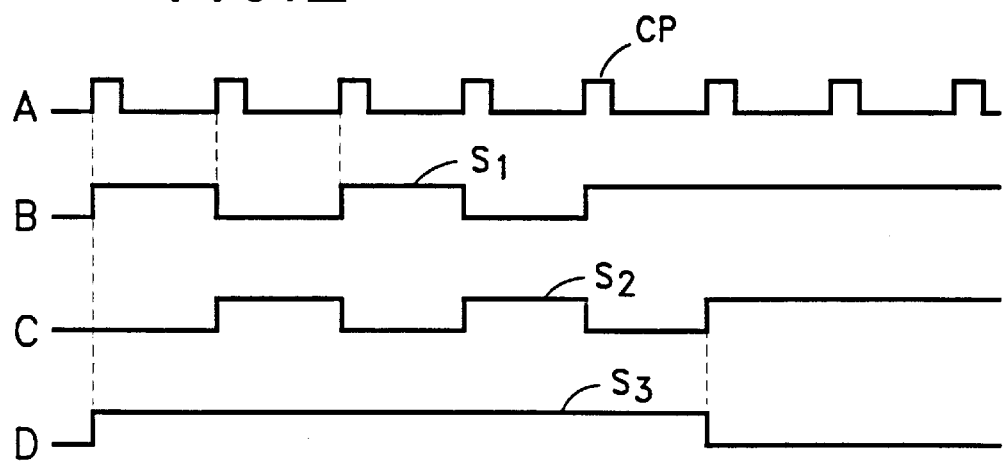
FIG. 2 is a timing chart showing an operation of the circuit of FIG. 1.

As shown in FIG. 2, the signal detecting circuit 15 outputs the H-logic signal while the driving signal $S_1$ is given to the target circuit 11 and turns off the current applied to the heater elements H. During this period, the target circuit 11 generate self-heat because of the operation driven by the drive signal $S_1$. When the driving signal $S_1$ is stopped by the H-logic or L-logic, the signal detecting circuit 15 outputs the L-logic and turns on the switch elements 13 so as to apply the current to the heater elements H. As a result, the heater elements H are energized to generate heat instead of the self-heat of the target circuit 11, and the temperature inside the chip 10 is maintained at the same degree.

Figure 3:
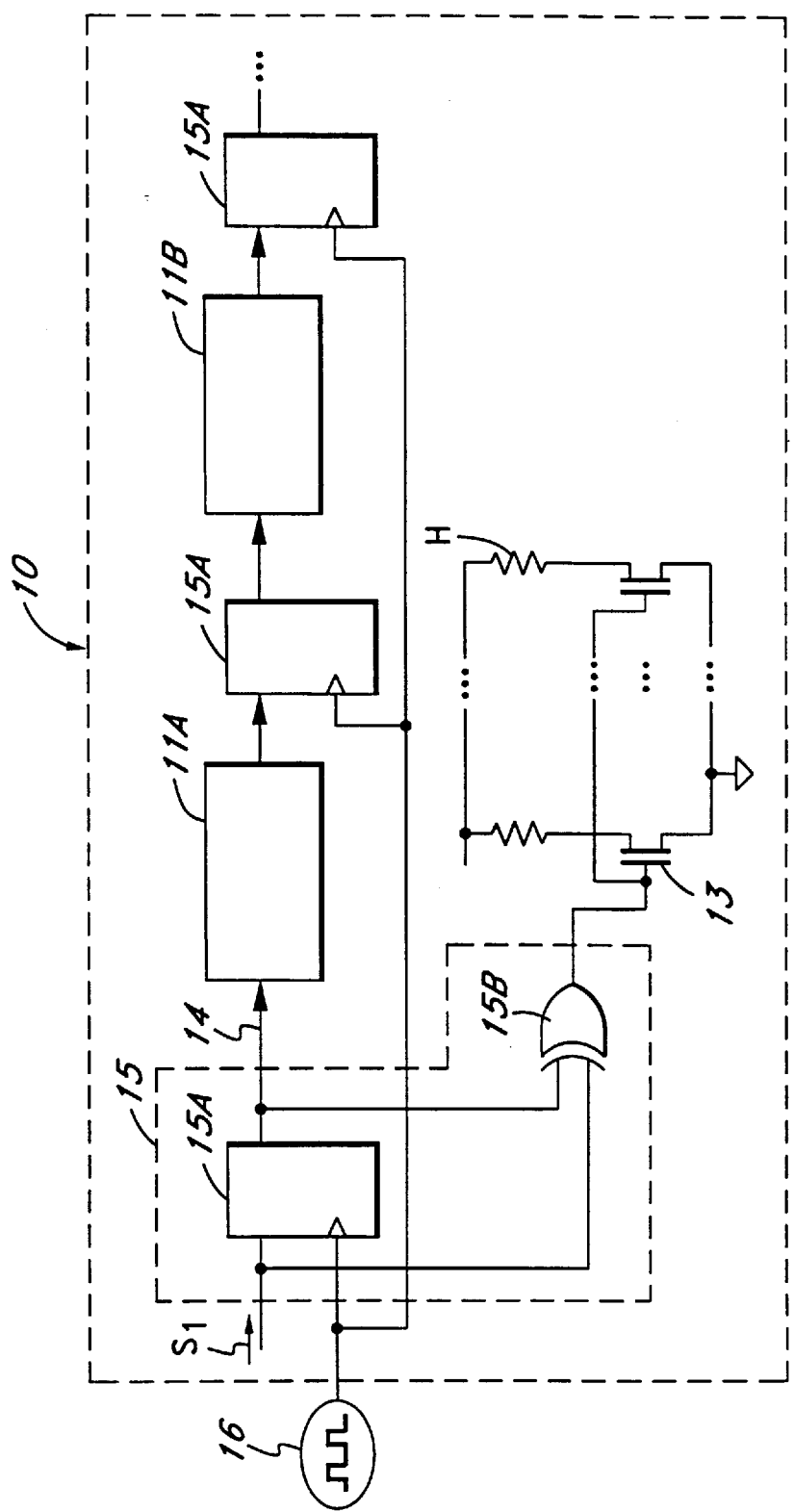
FIG. 3 is a circuit diagram showing another embodiment of the present invention.

FIG. 3 shows another embodiment of the present invention. In this embodiment, a plurality of target circuits 11A and 11B are provided in series in the chip 10. Between the target circuits 11A and 11B, an additional D-type flip-flop 15A is connected in the same manner as the flip-flop 15A in the embodiment of FIG. 1. The total amount of the current consumed in the heater elements H is arranged to be same as the total amount of the current consumed in the circuits 11A and 11B, as described in the foregoing embodiment.

According to the present invention, the supply of the current to the heater elements H stops in real time when the supply of the signal to the target circuits 11A and 11B begins. On the other hand, if the supply of the signal to the target circuits 11A and 11B stops, the heater elements H are turned on to generate heat.

In this invention, the current amount consumed in the chip 10 is remained constant regardless of whether the target circuits 11A and 11B are provided with the drive signal or not. Therefore, the temperature inside the chip 10 remains constant which effects to keep the delay times in the chip 10 in the same value. In addition, the total capacity of the electric power sources to the IC chip needs to be the current capacity which can endure the same current amount consumed only in the target circuit 11. Thus, the present invention also effective in reduction of the electric power consumption and associated costs.

Figure 4:
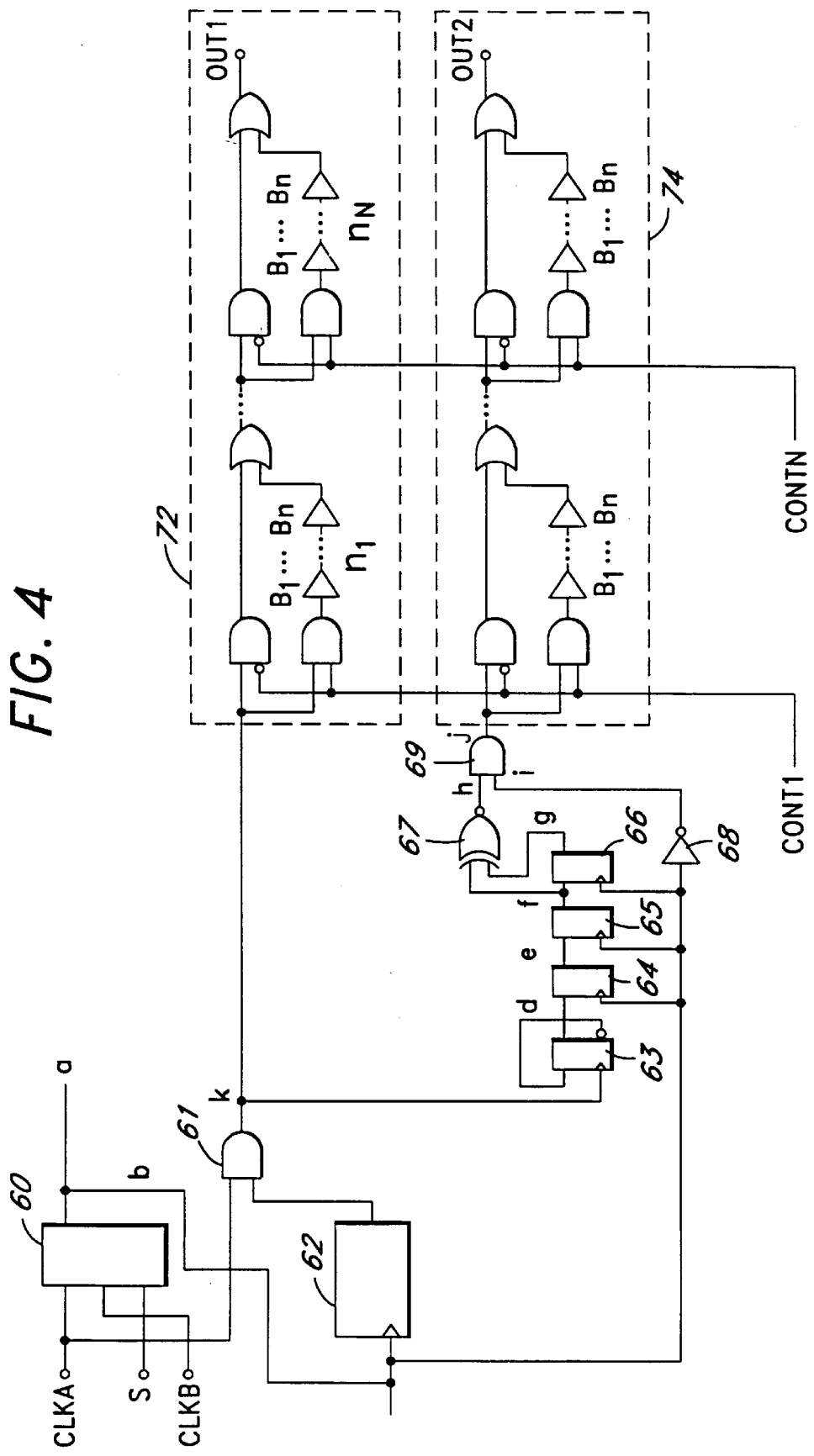
FIG. 4 is a circuit diagram showing an temperature compensation circuit of the second aspect of the present invention to be incorporated in an IC chip.

FIG. 4 is a circuit diagram showing an temperature compensation circuit of the second aspect of the present invention to be incorporated in an IC chip. In this embodiment, a selector 60 is provided with two kinds of clock signals CLKA and CLKB. The output of the selector 60 is connected to an input of a logical delay circuit 62 and to a series of flip-flops 63–66. The clock CLKA is also supplied to a variable delay circuit 72 through an AND gate 61. The output of the AND gate 61 is also provided to the data input of the flip-flop 63. The output of the flip-flop 66 is connected to an AND gate 69 though an Exclusive NOR gate 67 which also receives an output from the flip-flop 65 in a manner shown in FIG. 4.

The output of the AND gate 69 is connected to a variable delay circuit 74. The variable delay circuits 72 and 74 respectively include a plurality of sets of buffers $B_1$–$B_n$ serially connected to achieve delay times based on the propagation time delay in the buffers $B_1$–$B_n$. Each of the variable delay circuits 72 and 74 include means for changing a signal path with buffers $B_1$–$B_n$ and without buffers. In the example of FIG. 4, the variable delay circuit 74 works as a heater for generating heat to raise the temperature of the IC chip. A selector signal S is provided to the input of the selector 60 to select either one of the clocks CLKA or CLKB.

In this example, the temperature compensation circuit basically performs in two situations. The first situation arises when the clock CLKA is selected by the selector 60. The clock CLKA is masked for a certain period determined by the output of the logical delay circuit 62 which opens or closes the AND gate 61. The clock CLKA through the AND gate 61 is supplied to the variable delay circuit 72, and the variable delay circuit 74 through the series of flip-flops 63–66. In this arrangement, the sum of clock pulses per unit time provided in the variable delay circuits 72 and 74 becomes the same as that of the clock CLKA. Therefore, the overall heat generated by the variable delay circuits 72 and 74, which are closely positioned one another in the IC chip, becomes constant and uniform. Thus, there is no fluctuation in the heat generation due to the differences of the clock generation.

Second situation arises when the clock CLKB is selected by the selector 60. The clock CLKB has a higher frequency than the clock CLKA. The variable delay circuit 72 receives the clock CLKA through the AND gate 61 since the clock CLKA is directly supplied to the AND gate 61. On the other hand, the variable delay circuit 74 receives the difference between the clock CLKA and the clock CLKB by the logic circuits formed by the flip-flops 63–66, the Exclusive NOR gate 67 and the AND gate 69.

In this arrangement, the sum of the clock pulses per unit time received in both the variable delay circuits 72 and 74 becomes the same as that of the clock CLKB. Therefore, the total amount of heat generation caused by the clocks in the variable delay circuits 72 and 74, which are positioned close each other in the IC chip, becomes constant. Thus, there is no fluctuation in the heat generation due to the change of the frequency of the clock CLKA provided to the variable delay circuit 72.

Figure 5:
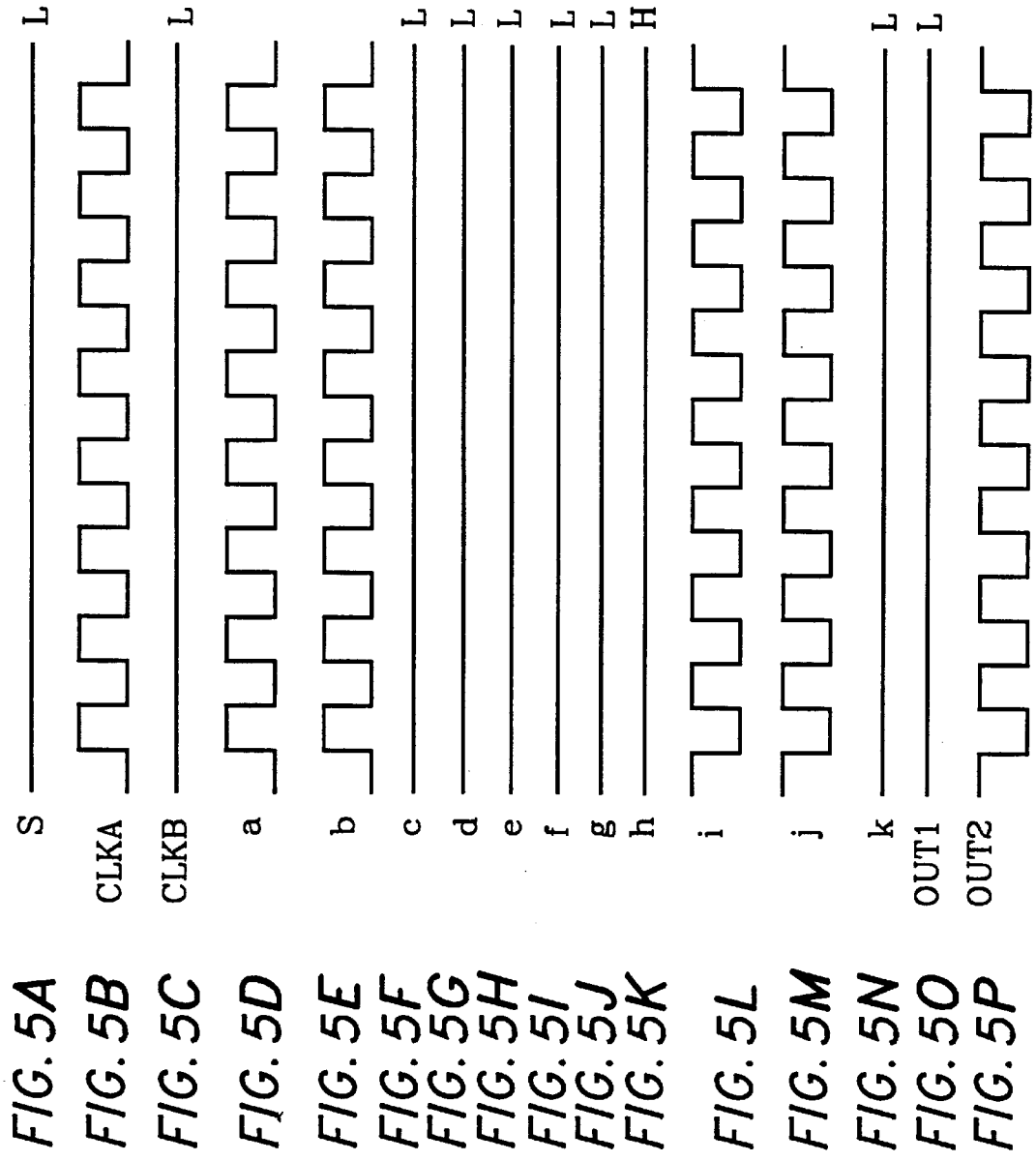
FIGS. 5A–5P are a timing chart showing a timing relationship in the temperature compensation circuit of FIG. 4.

FIG. 5 shows a timing diagram of the signals in the first situation above. When the select signal S (FIG. 5A) of the selector 60 is at L-level, the clock CLKA is selected as a signal a (FIG. 5D) in the first situation. In this situation, a frequency $f_1$ is set in the clock CLKA. In the example of FIG. 5, an output c of the logic delay circuit 62 is fixed to the L-level, wherein the output c is synchronized with the signal a (Figure F). Since the input signal c of the AND gate 61 is in the L-level, an output signal k of the AND gate 61 maintains the L-level as shown in FIG. 5N. Since the output signal k maintains the L-level, the following variable delay circuit 72 also maintain the L-level.

As a result, an output OUT1 remains the L-level (FIG. 5O). On the other hand, outputs e, f, g of the flip-flops 64–66 are all in the L-level (FIGS. 5H, 5I and 5J), wherein the signal a is input therein as a clock. As a result, an output h of the Exclusive NOR 17 becomes H-level (FIG. 5K). Thus, the signal a having the frequency $f_1$ is inverted by the inverter 68 (signal i) and passes through the AND gate 69 (FIG. 5L). As a result, an output signal j (FIG. 5M) of the AND gate 69 is generated at an output OUT2 through the variable delay circuit 74 (FIG. 5P).

The variable delay circuit 72 having the output OUT1 and the variable delay circuit 74 having the output OUT2 are identical one another. Further, since the physical circuit patterns of the variable delay circuits 72 and 74 are arranged in close proximity with each other in the IC chip, both variable delay circuits 72 and 74 can be considered as one set of circuit in terms of internal temperature. Namely, the variable delay circuits 72 and 74 are in the same temperature environment in the IC chip.

Therefore, in the present invention, since the total numbers of pulses passing the variable delay circuit 72 and the variable delay circuit 74 is always the same as the number of pulses of the signal a (frequency $f_1$ in this case), overall heat dissipation by the operation of both delay circuits 72 and 74 is constant and stable. In the preferred embodiment, the variable delay circuit 72 is used to provide an actual delay time to a test signal in a channel while the variable delay circuit 74 is used as a heat generator.

Figure 6:
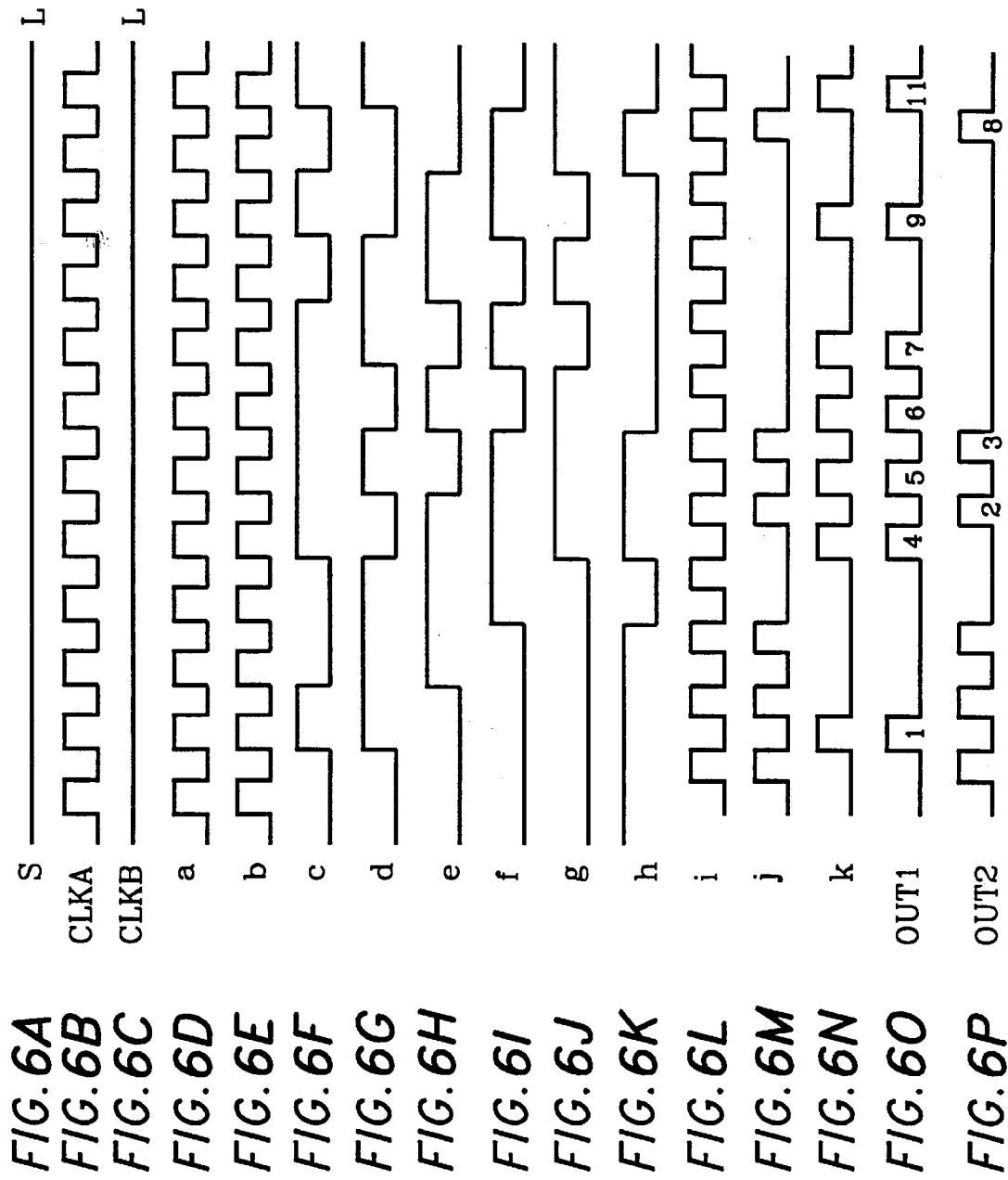
FIGS. 6A–6P are a timing chart showing a timing relationship in the temperature compensation circuit of FIG. 4.

FIG. 6 is a timing diagram when a signal S is in the L-level and the signal frequency in the variable delay circuit 72 is changed by the logical delay circuit 62. Since the clock CLKA (FIG. 6B) is selected by the selector 60, the signals a and b (FIGS. 6D and 6E) are also the clock CLKA. The signal c (FIG. 6F) is output by the logical delay circuit 62 so as to partially prohibit the clock CLKA to pass through the AND gate 61 and to the variable delay circuit 72. The flip-flop 63 changes its state (signal d shown in FIG. 6G) every time when the signal k (FIG. 6N) which is the gated clock CLKA is provided thereto.

The output signal d is delayed by the further flip-flops 64–66 by the signal a with the clock frequency $f_1$ (FIGS. 6H, 6I and 6J). The signal h (FIG. 6K) which is an output of the Exclusive NOR 67 and determined by ;the signals f and g the outputs of the flip-flops 65 and 66 respectively. When the signal h is in the H-level, a signal i which is the inverted the signal a having the frequency $f_1$ is output from the AND gate 19 and thus becomes the OUT2 output.

Upon the above-described operations, the sum of the pulses passing through the variable delay circuits 72 and 74 is the same as the frequency $f_1$. As a result, the overall heat generation by the variable delay circuits 72 and 74 is always constant, and thus, the temperature surrounding the variable delay circuits 72 and 74 is also constant.

Figure 7:
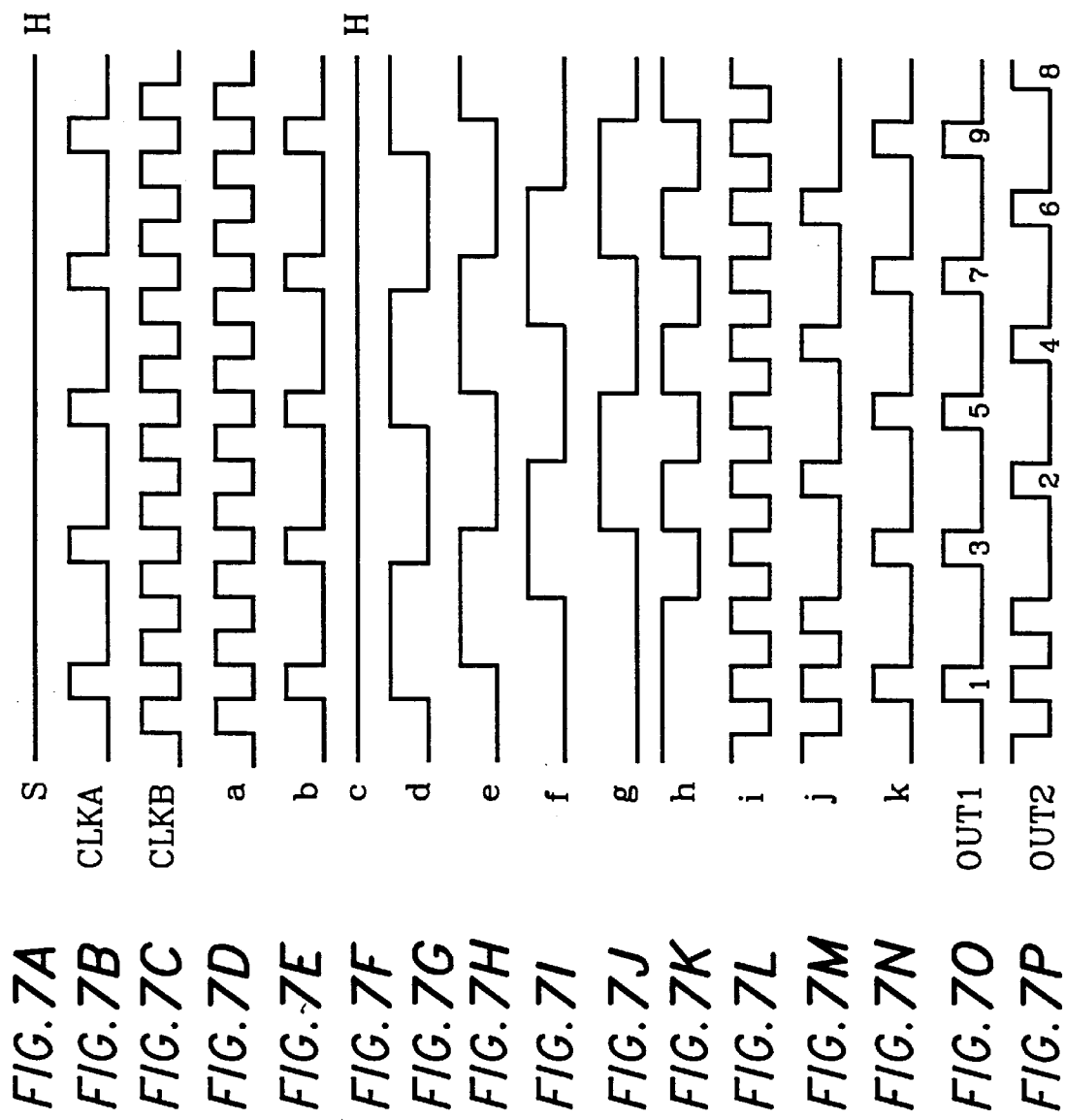
FIGS. 7A–7P are a timing chart showing a timing relationship in the temperature compensation circuit of FIG. 4.

In FIG. 7, the signal S is in the H-level by which the clock CLKB is selected as the signal a by the selector 60. In this example, the clock CLKB is set to the frequency $f_1$ and the clock CLKA is set to the frequency $f_1/2$, although the frequency relationship therebetween is arbitrary. The output of the logical delay circuit 62 is in the H-level and does not affect the other logic operations. The clock CLKA having the frequency $f_1/2$ is output at the AND gate 61 as the signal k (FIG. 7N) and then passes through the variable delay circuit 72 and to the output terminal OUT1 (FIG. 7O).

The signal d at the output of the flip-flop 63 is inverted (FIG. 7G) at every pulse of the signal k. The signal d is synchronized with the signal a and shifted at the flip-flops 64–66 so as to output intervals to the signal h (FIG. 7K) from the Exclusive NOR gate 67 to control the AND gate 67. The signal i (FIG. 7L) which is the inverted signal a having the frequency $f_1$ is supplied to the AND gate 69. Thus, the signal j (FIG. 7M) is obtained at the output of the AND gate 69 which opens when the signal h is in the H-level. The signal j passes through the variable delay circuit 74 which functions as a heater and outputs at the output terminal OUT2 (FIG. 7P). The frequency of signal j is $f_1/2$ as shown in FIG. 7M. Therefore the sum of the pulses pass through both the variable delay circuits 72 and 74 is equal to the frequency $f_1$.

Figure 8:
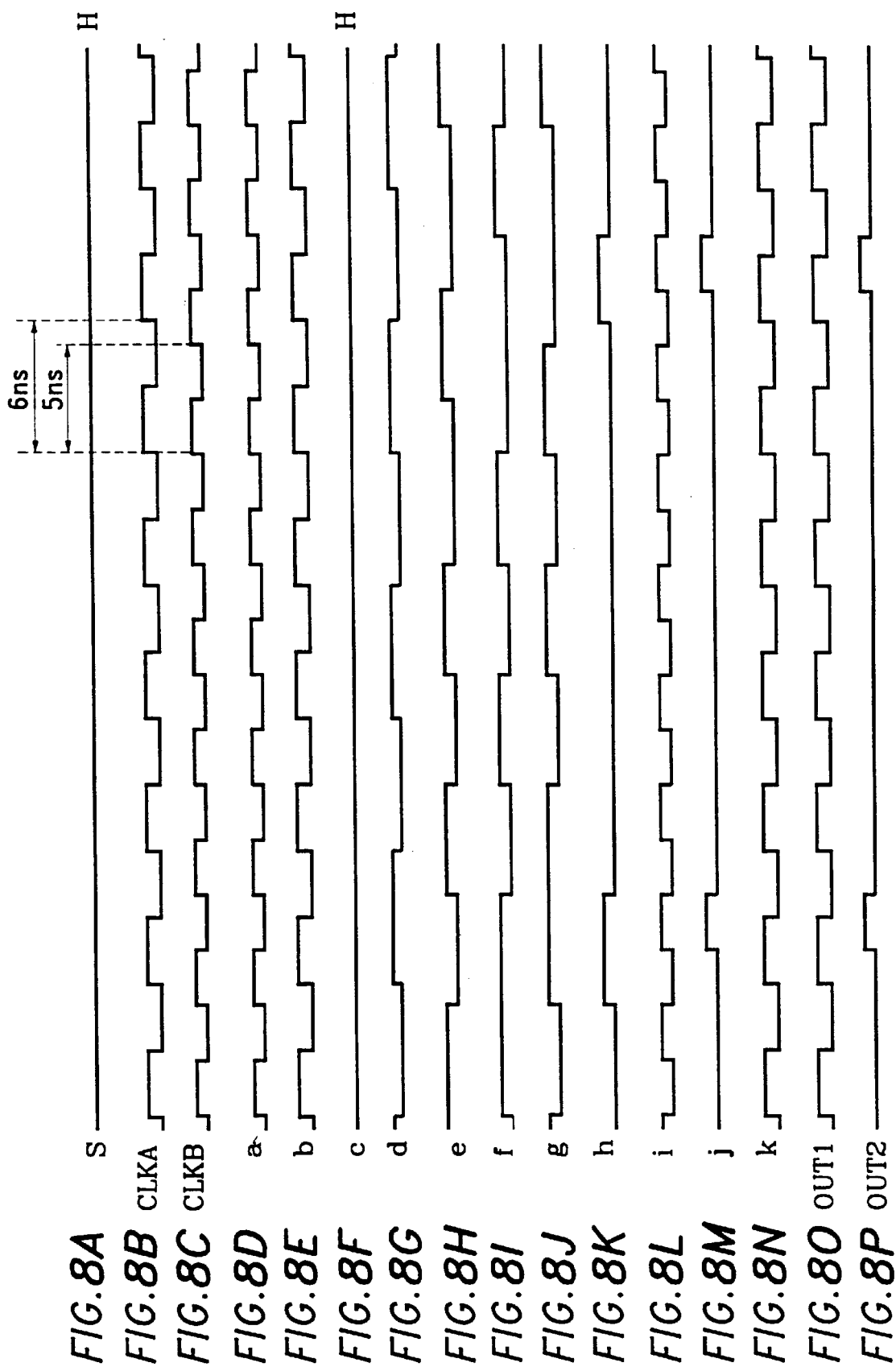
FIGS. 8A–8P are a timing chart showing a timing relationship in the temperature compensation circuit of FIG. 4.
Figure 9:
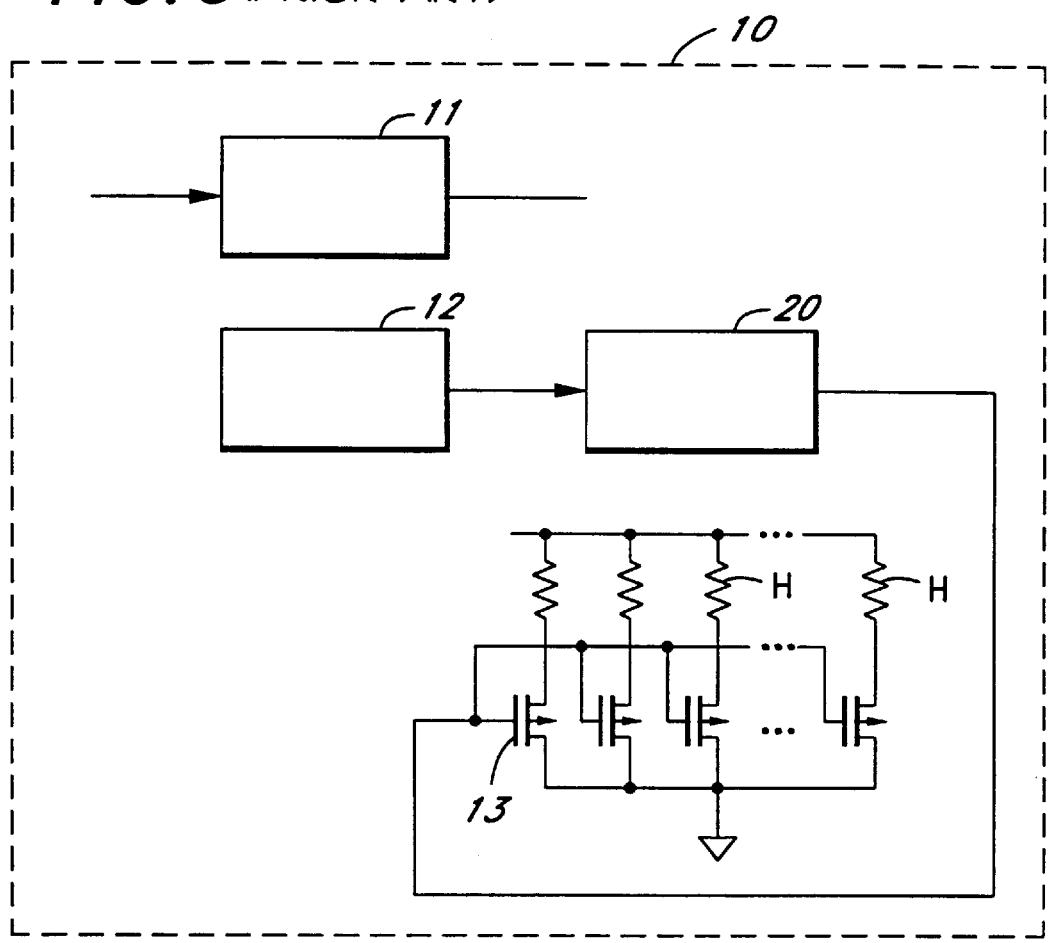
FIG. 9 shows a structure of the conventional IC having a temperature compensatory function therein.
Figure 10:
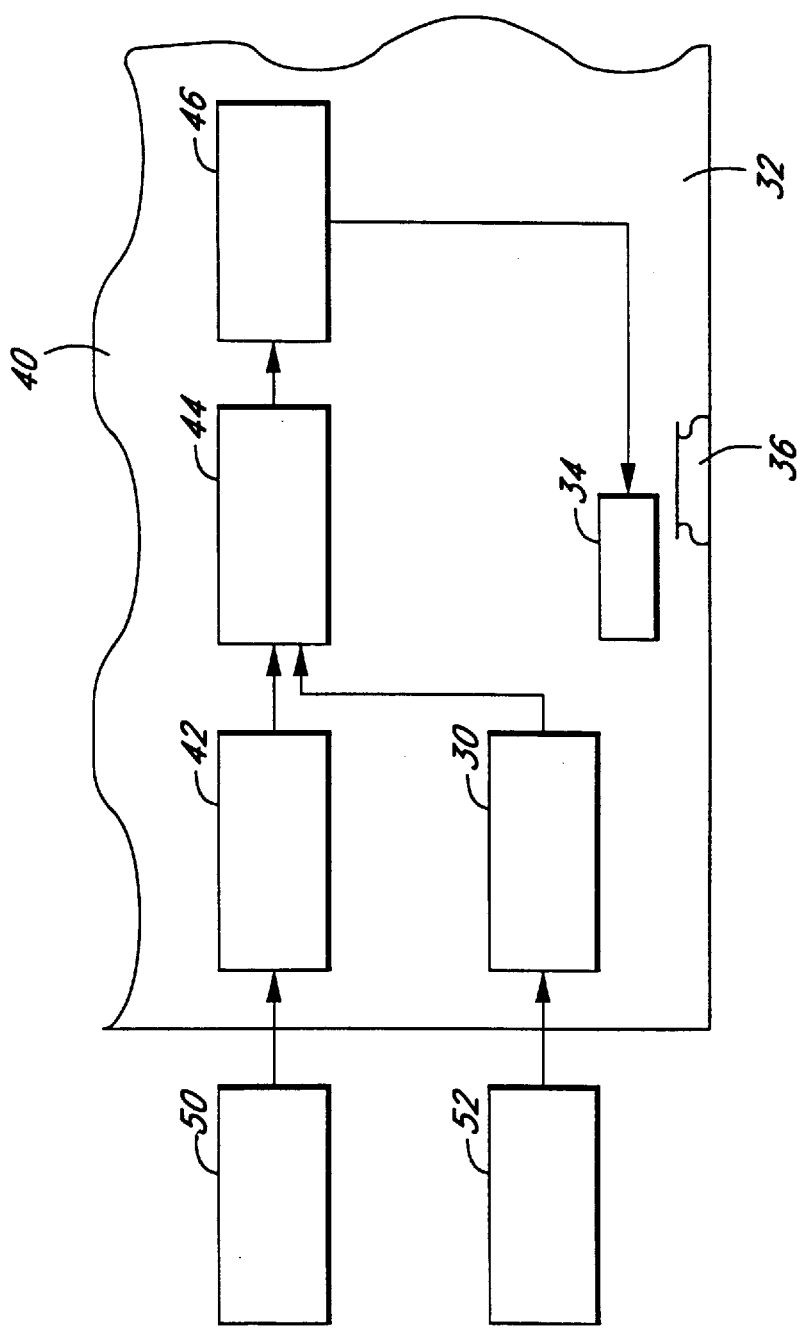
FIG. 10 shows another example of conventional structure of a temperature compensation circuit of an IC chip.

FIG. 8 shows a timing diagram when the signal S is in the H-level. In this case, the CLKA is set to 166 MHz (period 6 ns, i.e., 6 pulses in 30 nanosecond) and the CLKB is 200 MHz (period 5 ns, i.e., 6 pulses in 30 nanosecond). The logical delay circuit 62 is set to the H-level. As has been described, the variable delay circuit 72 receives the signal k (FIG. 8N) having the same frequency as the clock CLKA, i.e., 166 MHz and outputs the same to the output terminal OUT1 (FIG. 8O).

The signal j (FIG. 8M) from the AND gate 69 passes through the variable delay circuit 74 OUT2 and outputs at the output terminal OUT2 (FIG. 8P). The frequency of the signal j is determined by the circuit arrangement formed of the flip-flops 63–66 and the Exclusive NOR gate 67 so that the sum of the pulses in the signals k and j is equal to the frequency of the clock CLKB. In this example, for a period of 30 ns, for example, 5 pulses are provided as the clock CLKA and 6 pulses are provided as the clock CLKB. As shown in FIG. 8O, 5 pulses passes through the variable delay circuit 72 in 30 ns and one pulse passes through the variable delay circuit 74 in 30 ns. Therefore, the total of 6 pulses pass through in the variable delay circuits 72 and 74, which is equivalent to the frequency of clock CLKB. As a result, the total amount of heat generation by the delay circuits 72 and 74 are always constant which is determined by the number of pulses in the clock CLKB.

Although this invention has been disclosed and illustrated with reference to particular applications, the principles involved are susceptible of numerous other applications which will be apparent to those skilled in the art. The invention is, therefore, to be limited only as indicated by the scope of the claims.

What is claimed is:

1. A temperature compensation circuit for an IC chip, comprising:

a signal detecting circuit for supplying a S logic signal to a target circuit;

a heater formed of a semiconductor element; and a switch for switching electric current applied to said heater every time when said signal detecting circuit detects the supply of said logic signal to said target circuit.

2. A temperature compensation circuit as defined in claim 1, wherein said heater is comprised of a plurality of semiconductor transistors.

3. A temperature compensation circuit as defined in claim 1, wherein said signal detecting circuit includes a flip-flop circuit and an exclusive OR circuit.

4. A temperature compensation circuit as defined in claim 1, wherein a plurality of flip-flops are provided corresponding to a plurality of target circuits in series.

5. A temperature compensation circuit for an IC chip, comprising:
- a first circuit for transmission of a pulse signal to be used as a test signal for an electronic device;
- a second circuit having substantially the same circuit structure as that of the first circuit, said second being used as a heater and arranged in close proximity with said first circuit;
- a selector which is provided with two clock signals having different frequencies, said selector being controlled to select one of said clock signals;
- a logical delay circuit for producing a delay time which is a multiple of a period of one of said clock signals;
- a mask circuit for prohibiting the selected clock signal from passing therethrough for a certain period of time determined by said logical delay circuit, said mask circuit providing its output to said first circuit;
- a clock number adjusting circuit for adjusting the number of clock signals to be provided to the second circuit so that the sum of the number of pulses supplied to the first and second circuits is always equal to the clock signal of higher frequency.

6. A temperature compensation circuit as defined in claim 5, wherein said clock number adjusting circuit includes a plurality of flip-flops, an exclusive OR gate and an AND gate.

* * * * *